(12) United States Patent
Voix et al.

(10) Patent No.: US 10,097,149 B2
(45) Date of Patent: Oct. 9, 2018

(54) ADVANCED COMMUNICATION EARPIECE DEVICE AND METHOD

(71) Applicant: EERS GLOBAL TECHNOLOGIES INC., Montréal (CA)

(72) Inventors: Jérémie Voix, Montréal (CA); Jean-Nicolas Laperle, Montréal (CA); Jakub Mazur, Montréal (CA); Antoine Bernier, Montréal (CA)

(73) Assignee: EERS GLOBAL TECHNOLOGIES INC., Montréal, QC ( * ) Notice: Subject to any disclaimer, the term of this patent is extended or adjusted under 35 U.S.C. 154(b) by 179 days.

(21) Appl. No.: 14/992,740

(22) Filed: Jan. 11, 2016

(65) Prior Publication Data

US 2016/0126914 A1 May 5, 2016

Related U.S. Application Data

(62) Division of application No. 13/991,258, filed as application No. PCT/CA2011/001312 on Dec. 1, 2011, now abandoned.

(60) Provisional application No. 61/344,977, filed on Dec. 1, 2010.

(51) Int. Cl.
| | |
|---|---|
| H03G 3/32 | (2006.01) |
| H04R 1/10 | (2006.01) |
| H04R 5/04 | (2006.01) |
| H03G 3/20 | (2006.01) |
| H04R 3/00 | (2006.01) |

(Continued)

(52) U.S. Cl.
CPC .......... *H03G 3/32* (2013.01); *G10L 21/0216* (2013.01); *H03G 3/20* (2013.01); *H04R 1/1016* (2013.01); *H04R 1/1083* (2013.01); *H04R 3/007* (2013.01); *H04R 5/04* (2013.01); *H04R 29/004* (2013.01); *H04R 29/001* (2013.01); *H04R 2201/107* (2013.01); *H04R 2410/01* (2013.01); *H04R 2430/01* (2013.01); *H04R 2460/01* (2013.01); *H04R 2460/05* (2013.01)

(58) Field of Classification Search
CPC .... H04R 1/1016; H04R 1/1083; H04R 3/007; H04R 5/04; H04R 29/001; H04R 29/004; H04R 2201/107; H04R 2410/01; H04R 2430/01; H04R 2460/01; H04R 2460/05; H03G 3/32; H03G 3/20; G10L 21/0216
USPC ......................................... 381/57
See application file for complete search history.

(56) References Cited

U.S. PATENT DOCUMENTS

| | | | | |
|---|---|---|---|---|
| 5,208,867 A | * | 5/1993 | Stites | ...................... H04B 1/38 181/135 |
| 7,929,713 B2 | * | 4/2011 | Victorian | ............. H04R 25/554 381/110 |

(Continued)

*Primary Examiner* — Davetta W Goins
*Assistant Examiner* — Daniel Sellers
(74) *Attorney, Agent, or Firm* — Praxis

(57) ABSTRACT

An earpiece device (10, 110, 210, 210') provides advanced communication to the user thereof, for controlling a total sound dose (TND), including an audio output from an audio source (16) reaching an ear of the user occluded at the outer ear canal (15) by an in-ear device (14), for allowing an external ambient sound to be heard by the ear of the user, and for allowing a voice (NSV) of the user to be transmitted to a telecommunication transmission link (TTL). The present invention also contemplates a method of operation of the earpiece device (10, 110, 210, 210').

4 Claims, 4 Drawing Sheets

(51) Int. Cl.
*H04R 29/00* (2006.01)
*G10L 21/0216* (2013.01)

(56) References Cited

U.S. PATENT DOCUMENTS

2008/0181419 A1* 7/2008 Goldstein .............. H04R 3/002
 381/57
2008/0260180 A1* 10/2008 Goldstein .............. H04R 25/50
 381/110

* cited by examiner

ADVANCED COMMUNICATION EARPIECE DEVICE AND METHOD

CROSS REFERENCE TO RELATED APPLICATIONS

The present application is a divisional application of pending patent application Ser. No. 13/991,258 filed on Sep. 16, 2013, which is a national phase entry of PCT application No. PCT/CA2011/001312 filed on Dec. 1, 2011, which claims priority benefit of provisional application for patent No. 61/344,977 filed on Dec. 1, 2010, all of which being incorporated herein by reference.

FIELD OF THE INVENTION

The present invention relates to earpiece devices and is more particularly concerned with an earpiece device providing advanced communication to the user thereof, and method of operation thereof.

BACKGROUND OF THE INVENTION

The noisy environment in our industrial society is a health hazard to numerous workers as well as to people engaged in recreational activities generating loud noises, or simply listening to music with varying volume settings from individual digital music players such as an Ipod™, MP3 players or the like, via a set of earphones or the like.

Many documents such as U.S. Pat. No. 3,789,952 granted to Widegren et al., U.S. Pat. No. 7,151,835 granted to Yonovitz et al., US patent publication No. 2009/0208024 A1 to Farver and European patent No. EP 1,816,892 B2 to Ruwisch aim at limiting the harm produced by the continuous estimated noise/sound reaching the user's ear which could induce permanent partial hearing loss. These methods and devices typically integrate by estimation the total noise dose received by the user's ear, considering a sound generation via the speaker inside the headset of the user, as well as the estimated added noise contribution of the user surroundings or environmental noise as measured by and external microphone located on the headset. Upon the calculated total dose reaching a pre-determined threshold, an action or protective measure is taken by the processor.

These integrated total doses are estimated depending on the type of earpiece or headset being worn by the users, and considering their partial occlusion of the ear canals, the estimated cumulative total doses are only estimations and not real measures of the ear exposures. These estimations do not take into account the actual positioning of the earpieces inside the user's ears, which may vary considerably from one user to another, as opposed to constant and known occlusion occurring when using custom-fitted in-ear devices, as disclosed in U.S. Pat. No. 6,754,357 granted to McIntosh et al., U.S. Pat. No. 6,687,377 granted to Voix et al., and U.S. Pat. No. 7,688,983 granted to Voix et al. Furthermore, these estimated integrations do not take into consideration the fact that the human ear rests, or recuperates from auditory fatigue over time, especially when the sound pressure level or the ambient noise is relatively low.

With the always increasing popularity of personal music players (PMP) or the like, users tend to constantly wear the headphones to listen music or the like. In such cases, the users essentially become acoustically disconnected, at least partially, from surrounding ambient sounds and/or noises, which could cause dangerous situations. In order to be in hearing contact with the environment, the users need to either significantly reduce the sound or playback volume of the PMP or remove at least one of the two headphones, which might become annoying, especially if that kind of situation occurs frequently.

Many documents such as U.S. Pat. No. 3,819,860 granted to Miller, U.S. Pat. No. 6,754,359 granted to Svean et al., and U.S. Pat. No. 7,502,484 granted to Ngia et al. teach an ear terminal with an internal microphone for clean voice pickup from the user. This measured voice signal, although clean (essentially noiseless), is not a natural speech voice since the higher frequencies have essentially been transformed, by the surrounding body parts, into lower frequencies, giving the impression of an occlusion effect in that the voice is muffled or captured from inside a box, or closed cavity or the like, such that it is not preferred for transmission via a telecommunication network or the like.

Accordingly, there is a need for an improved earpiece device and method.

SUMMARY OF THE INVENTION

It is therefore a general object of the present invention to provide an improved earpiece device and method that obviate the above-mentioned disadvantages.

An advantage of the present invention is that the earpiece device provides for a more accurate calculation of the total noise dose reaching a specific ear, by taking advantage of using a custom-fitted in-ear device (with improved occlusion of the ear canal), which allows evaluation of occurring sound bursts, and measuring the actual impact thereof inside the occluded ear canal, behind the earpiece.

Another advantage of the present invention is that the earpiece device considers a relative ear fatigue recuperation over time when continuously calculating the cumulated total noise or sound dose.

A further advantage of the present invention is that the earpiece device can detect if the earpiece is actually being worn by the user or not, and reflect this situation into the calculation of the cumulated total noise or sound dose.

Yet another advantage of the present invention is that the earpiece device provides for a more accurate calculation of the total sound dose reaching a specific ear.

Another advantage of the present invention is that the earpiece device provides for the user to selectively disable the audio signal reaching the speaker of the headphone(s) temporarily, permanently or for a predetermined time duration, and allow the user to hear, via the headphone speaker, the external ambient noise measured by an external microphone located on the corresponding headphone.

A further advantage of the present invention is that the earpiece device provides to the user the capability of individually varying the ratio of sound volume playing in the background (external microphone) and of the audio source to mix or crossfade the signals before they are being played by the speaker of the earpiece.

Yet a further advantage of the present invention is that the earpiece device provides for ambient sound noise gating (ASNG) to allow the external ambient noise measured by the corresponding external microphone to be gated in removing the excessive ambient noise therefrom and keep only noise emerging signals.

Yet another advantage of the present invention is that the earpiece device allows the user to select a desired gate threshold for the ASNG, thereby adjusting the sensitivity level of the ambient noise to be transferred to the speaker of the corresponding headphone speaker.

Still another advantage of the present invention is that the earpiece device, in transmitting the ambient noise measured by the corresponding external microphone, ensures an unaltered localization of the incoming noise that enables the user to detect the source direction of that ambient noise because of the localization of the external microphone in close proximity of the corresponding user's ear.

Another advantage of the present invention is that the earpiece device provides for user's voice pickup from the user's ear for transmission thereof, via an earpiece internal microphone.

Still another advantage of the present invention is that the earpiece device provides for simultaneous user's voice pickup from an earpiece external microphone, which allows for a combination of the two internal and external microphone signals for clearer and more acoustically natural voice, which combination depends on the comparison between the two signals to prevent ambient noise perturbations, whenever applicable.

According to an aspect of the present invention, there is provided a sound dose limiter device for controlling a total sound dose reaching an ear of a user, said limiter device comprising:

an in-ear device for substantially occluding an outer ear canal of the user, said in-ear device including a speaker for providing an audio signal input from an audio output of an audio source inside the outer ear canal, an internal microphone for measuring a sound pressure level inside the occluded outer ear canal, and an external microphone for measuring an external ambient sound pressure level reaching the user's ear; and a controller device connecting to the internal and external microphones for receiving respective internal and external measured sound pressure levels and for receiving the audio output, said controller device performing an evaluation of the internal and external measured sound pressure levels, calculating a cumulative total sound dose from the internal sound pressure level and the audio signal input depending on the evaluation, and controlling the audio signal input transmitted to the speaker.

In one embodiment, the controller device further calculates, based on a level of the audio signal input, an estimated sound dose decrease so as to account for a fatigue recuperation of the user's ear over time, the estimated sound dose decrease being subtracted from the cumulative total sound dose.

Conveniently, the controller device repeatedly performs the evaluation and calculations over a predetermined time interval.

In one embodiment, the controller device further includes a display connecting to the controller device, said display displaying an information from the controller device corresponding to the calculated cumulative total sound dose.

Conveniently, the controller device further calculates an estimated listening remaining time of transmission of the audio output to the audio signal input before the calculated cumulative total sound dose reaches a maximum acceptable sound dose threshold based on the internal sound pressure level and/or the audio signal input depending on the evaluation.

Typically, the information is the estimated remaining listening time.

Conveniently, upon the estimated calculated cumulative total sound dose approaching the maximum acceptable sound dose threshold within a predetermined time threshold, the controller device further transmits a warning signal to the display and/or the speaker.

Alternatively, upon the estimated calculated cumulative total sound dose approaching or reaching the maximum acceptable sound dose threshold within a predetermined time threshold, the controller device further takes an auditory action.

Conveniently, the auditory action is a progressive decrease of the audio signal input transmitted to the speaker.

Alternatively, the auditory action is a stop of transmission of the audio signal input to the speaker.

According to another aspect of the present invention, there is provided a method for calculating a total sound dose reaching an ear of a user wearing an in-ear device substantially occluding a user's outer ear canal, the in-ear device including a speaker for providing an audio signal input from an audio output of an audio source inside the outer ear canal, an internal microphone for measuring a sound pressure level inside the occluded outer ear canal, and an external microphone for measuring an external ambient sound pressure level reaching the user's ear, said method comprising the steps of:

measuring, during a predetermined time interval, the internal and external sound pressure levels, and the audio output;

performing an evaluation of the internal and external measured sound pressure levels;

calculating a current interval total sound dose from the internal sound pressure level and the audio signal input depending on the evaluation, and a cumulative total sound dose based on previous time intervals; and controlling the audio signal input transmitted to the speaker.

In one embodiment, the step of calculating includes calculating, based on a level of the audio signal input, a current interval estimated sound dose decrease so as to account for a fatigue recuperation of the user's ear over time, the estimated sound dose decrease being subtracted from the cumulative total sound dose.

Conveniently, the step of evaluating includes comparing, over the predetermined time interval, the internal and external sound pressure levels to determine if both correlate and/or are coherent with one another, and if the external sound pressure level is larger than the internal sound pressure level by at least a predetermined level difference; and wherein the step of calculating includes calculating a current interval total sound dose from the audio signal input when the internal and external sound pressure levels do not correlate and/or are not coherent with one another, form the internal sound pressure level when the internal and external sound pressure levels correlate and/or are coherent with one another and when the external sound pressure level is not larger than the internal sound pressure level by at least the predetermined level difference, and from an addition of the audio signal input and the internal sound pressure level when the internal and external sound pressure levels correlate and/or are coherent with one another and when the external sound pressure level is larger than the internal sound pressure level by at least the predetermined level difference.

In one embodiment, the step of controlling includes displaying an information corresponding to the calculated cumulative total sound dose onto a display.

Conveniently, the step of calculating includes estimating a listening remaining time of transmission of the audio output to the audio signal input before the calculated cumulative total sound dose reaches a maximum acceptable sound dose threshold based on the internal sound pressure level and/or the audio signal input depending on the evaluation.

Typically, the step of controlling includes displaying the estimated listening remaining time.

In one embodiment, the step of calculating includes determining if the calculated cumulative total sound dose approaches a maximum acceptable sound dose threshold, and
wherein the step of controlling includes, upon the calculated cumulative total sound dose approaching the maximum acceptable sound dose threshold, transmitting a warning signal to the display and/or the speaker.

In one embodiment, the step of controlling includes, upon the calculated cumulative total sound dose approaching or reaching the maximum acceptable sound dose threshold, taking an auditory action.

In one embodiment, the step of controlling includes, upon the calculated cumulative total sound dose approaching or reaching the maximum acceptable sound dose threshold within a predetermined time threshold, progressively decreasing the audio signal input transmitted to the speaker.

Conveniently, the step of controlling includes, upon the calculated cumulative total sound dose approaching or reaching the maximum acceptable sound dose threshold within a predetermined time threshold, progressively stopping transmission of the audio signal input to the speaker.

In one embodiment, the user wears two similar said in-ear device substantially occluding a corresponding said user's outer ear canal, the step of calculating includes calculating, for each said user's ear, a corresponding current interval total sound dose from the internal sound pressure level and the audio signal input depending on the evaluation, and a cumulative total sound dose based on previous time intervals and the largest one of the two said current interval total sound doses.

According to another aspect of the present invention, there is provided a push-to-hear device for allowing an external ambient sound to be heard by an ear of a user, said push-to-hear device comprising:
    at least one in-ear device for substantially occluding an outer ear canal of the user, said at least one in-ear device including a speaker for providing an audio signal input from an audio output of an audio source inside the outer ear canal, and an external microphone for measuring an external ambient sound pressure level reaching the user's ear; and
    a controller device connecting to the external microphone for receiving an external measured sound pressure level and for receiving the audio output, said controller device including an activation switch device activatable by the user, said controller device allowing the audio output to reach the speaker when the activation switch device is unactivated, and allowing the external ambient sound pressure level to reach the speaker when the activation switch device is activated, while at least partially disabling the audio output from reaching the speaker.

In one embodiment, the controller device allows the external ambient sound pressure level to reach the speaker when the activation switch device is activated, while totally disabling the audio output from reaching the speaker.

In one embodiment, the controller device further automatically and digitally adjusts the external ambient sound pressure level for a natural sounding thereof at the speaker of the in-ear device.

In one embodiment, the controller device further includes a second activation command device activatable by the user, said second activation command device allowing a predetermined value of a sound volume ratio of the external ambient sound pressure level over the audio output to reach the speaker when the second activation command device is activated, said second activation command device, when activated, deactivating said activation switch device.

Conveniently, the second activation command device further allows the user to modify the predetermined value of the sound volume ratio so as to vary the blending ratio thereof reaching the speaker when the second activation command device is activated.

In one embodiment, the controller device further includes an ambient sound noise gating filter device activatable by the user, said ambient sound noise gating filter device, when activated, eliminating a noise portion of the external ambient sound pressure level having an acoustic pressure smaller than a predetermined gating threshold from the external ambient sound pressure level so as to keep only a noise-emerging portion thereof at the speaker of the in-ear device.

Conveniently, the predetermined gating threshold is adjustable by the user.

According to another aspect of the present invention, there is provided a method for allowing an external ambient sound to be heard by an ear of a user wearing an in-ear device substantially occluding a user's outer ear canal, the in-ear device including a speaker for providing an audio signal input from an audio output of an audio source inside the outer ear canal, and an external microphone for measuring an external ambient sound pressure level reaching the user's ear, said method comprising the steps of:
    upon activation of an activation switch device activatable by the user, measuring the external ambient sound pressure level; and
    allowing the external ambient sound pressure level to reach the speaker, while at least partially disabling the audio output from reaching the speaker.

In one embodiment, the step of allowing includes allowing the external ambient sound pressure level to reach the speaker, while totally disabling the audio output from reaching the speaker.

In one embodiment, the step of allowing includes automatically and digitally adjusting the external ambient sound pressure level for a natural sounding thereof at the speaker of the in-ear device.

In one embodiment, the method further includes the steps of:
    upon activation of second activation command device activatable by the user, automatically deactivating said activation switch device and measuring the external ambient sound pressure level; and
    allowing a predetermined value of a sound volume ratio of the external ambient sound pressure level over the audio output to reach the speaker.

Conveniently, the method further includes the step of:
    allowing the user to modify the predetermined value of the sound volume ratio so as to vary the blending ratio thereof reaching the speaker when the second activation command device is activated.

In one embodiment, the method further includes the step of:
    upon activation of an ambient sound noise gating filter device activatable by the user, eliminating a noise portion of the external ambient sound pressure level having an acoustic pressure smaller than a predetermined gating threshold from the external ambient sound pressure level, whereby keeping only a noise-emerging portion thereof at the speaker of the in-ear device.

Conveniently, the method further includes the step of:
allowing the user to modify said predetermined gating threshold.

According to another aspect of the present invention, there is provided a communication device for allowing a voice of a user to be transmitted to a telecommunication transmission link, said communication device comprising:
an in-ear device for substantially occluding an outer ear canal of the user, said in-ear device including an internal microphone for measuring a sound pressure level inside the occluded outer ear canal, and an external microphone for measuring an external ambient sound pressure level reaching the user's ear, the internal and external measured sound pressure levels including respective acoustically deformed speech voice from the user; and
a controller device connecting to the internal and external microphones for receiving respective internal and external measured sound pressure levels, said controller device performing an evaluation of the external measured sound pressure level, digitally generating an enhanced natural speech voice signal from at least the internal sound pressure level depending on the evaluation, and transmitting the generated enhanced natural speech voice signal to the telecommunication transmission link.

In one embodiment, the controller device further generates the enhanced natural speech voice signal from the internal sound pressure level when the external measured sound pressure level is larger than a noise threshold.

Conveniently, when the external measured sound pressure level is smaller or equal to the noise threshold, the controller device generates the enhanced natural speech voice signal from both the internal and external sound pressure levels with greater content of the external sound pressure level than of the internal sound pressure level when the internal sound pressure level is generally larger than the external sound pressure level, and with greater content of the internal sound pressure level than of the external sound pressure level when the internal sound pressure level is generally smaller than the external sound pressure level.

Typically, when generating the enhanced natural speech voice signal from both the internal and external sound pressure levels, the controller device substantially combines, over a human voice frequency band, a high frequency portion of the external sound pressure level with a low frequency portion of the internal sound pressure level to generate the enhanced natural speech voice signal.

Alternatively, when the external measured sound pressure level is smaller or equal to the noise threshold, the controller device generates the enhanced natural speech voice signal from both the internal and external sound pressure levels when the internal and external sound pressure levels correlate and/or are coherent with one another, and from the internal sound pressure level when the internal and external sound pressure levels do not correlate and/or are not coherent with one another.

Typically, when generating the enhanced natural speech voice signal from both the internal and external sound pressure levels, said controller device substantially combines, over a human voice frequency band, a high frequency portion of the external sound pressure level with a low frequency portion of the internal sound pressure level to generate the enhanced natural speech voice signal.

According to another aspect of the present invention, there is provided a method for transmitting a voice of a user wearing an in-ear device substantially occluding a user's outer ear canal to a telecommunication transmission link, the in-ear device including an internal microphone for measuring a sound pressure level inside the occluded outer ear canal, and an external microphone for measuring an external ambient sound pressure level reaching the user's ear, the internal and external measured sound pressure levels including respective acoustically deformed speech voice from the user, said method comprising the steps of:
measuring the internal and external sound pressure levels;
performing an evaluation of the external measured sound pressure level;
digitally generating an enhanced natural speech voice signal from at least the internal sound pressure level depending on the evaluation; and
transmitting the generated enhanced natural speech voice signal to the telecommunication transmission link.

In one embodiment, the step of generating includes digitally generating the enhanced natural speech voice signal from the internal sound pressure level when the external measured sound pressure level is larger than a noise threshold.

In one embodiment, the step of generating includes, when the external measured sound pressure level is smaller or equal to the noise threshold, digitally generating the enhanced natural speech voice signal from both the internal and external sound pressure levels with greater content of the external sound pressure level than of the internal sound pressure level when the internal sound pressure level is generally larger than the external sound pressure level, and with greater content of the internal sound pressure level than of the external sound pressure level when the internal sound pressure level is generally smaller than the external sound pressure level.

Conveniently, the step of generating includes, when generating the enhanced natural speech voice signal from both the internal and external sound pressure levels, substantially combining, over a human voice frequency band, a high frequency portion of the external sound pressure level with a low frequency portion of the internal sound pressure level to generate the enhanced natural speech voice signal.

In one embodiment, the step of generating includes, when the external measured sound pressure level is smaller or equal to the noise threshold, digitally generating the enhanced natural speech voice signal from both the internal and external sound pressure levels when the internal and external sound pressure levels correlate and/or are coherent with one another, and from the internal sound pressure level when the internal and external sound pressure levels do not correlate and/or are not coherent with one another.

Conveniently, the step of generating includes, when generating the enhanced natural speech voice signal from both the internal and external sound pressure levels, substantially combining, over a human voice frequency band, a high frequency portion of the external sound pressure level with a low frequency portion of the internal sound pressure level to generate the enhanced natural speech voice signal.

Other objects and advantages of the present invention will become apparent from a careful reading of the detailed description provided herein, with appropriate reference to the accompanying drawings.

BRIEF DESCRIPTION OF THE DRAWINGS

Further aspects and advantages of the present invention will become better understood with reference to the description in association with the following Figures, in which similar references used in different Figures denote similar components, wherein.

DETAILED DESCRIPTION OF THE PREFERRED EMBODIMENTS

With reference to the annexed drawings the preferred embodiments of the present invention will be herein described for indicative purpose and by no means as of limitation.

Figure 1:
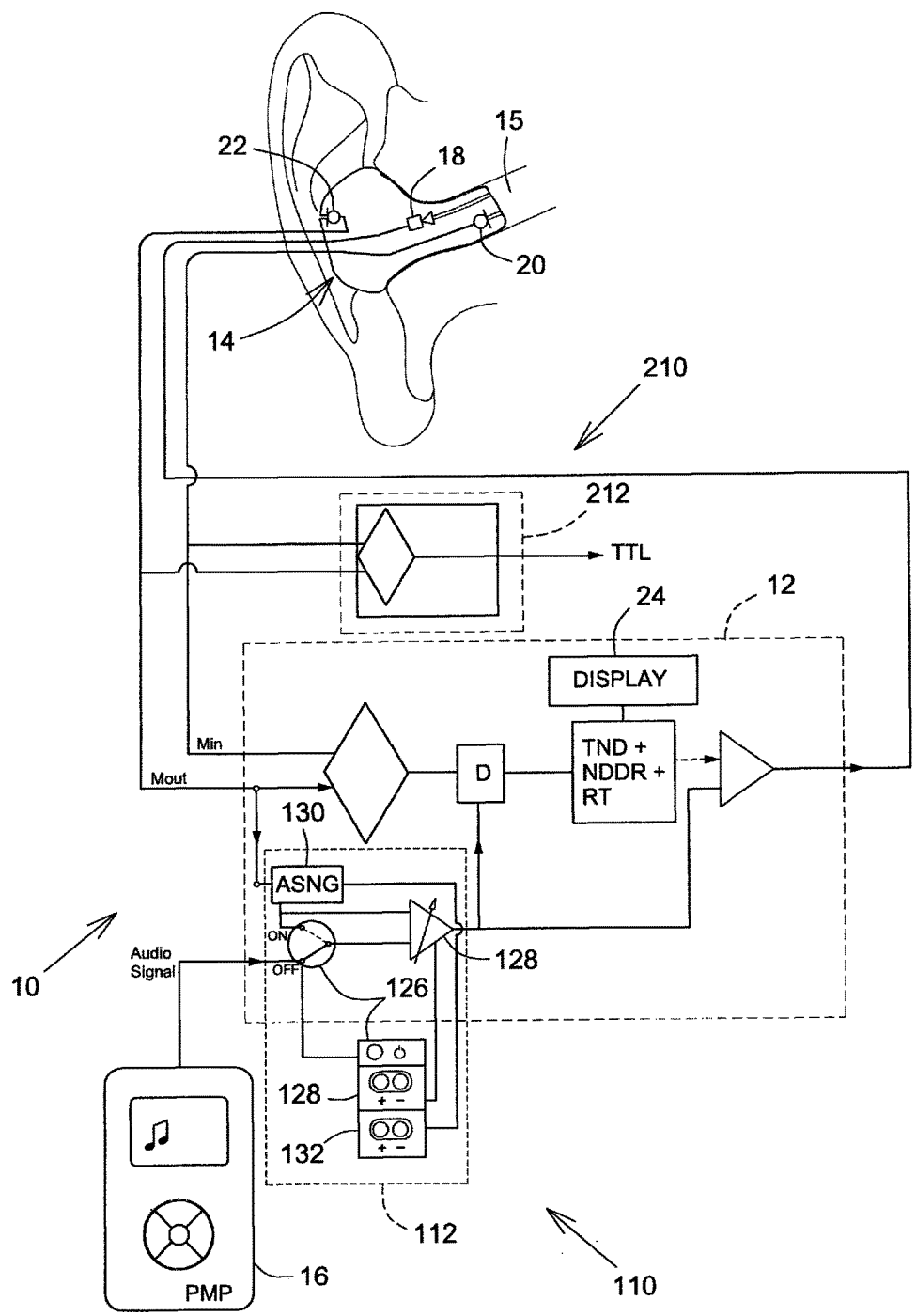
FIG. 1 is a simplified schematic bloc diagram of an advanced communication earpiece device in accordance with an embodiment of the present invention, referring to a noise and music dose limiter (MDL) device, and a push-to-hear (PTH) device, and an in-ear microphone (IEM) device.
Figure 2:
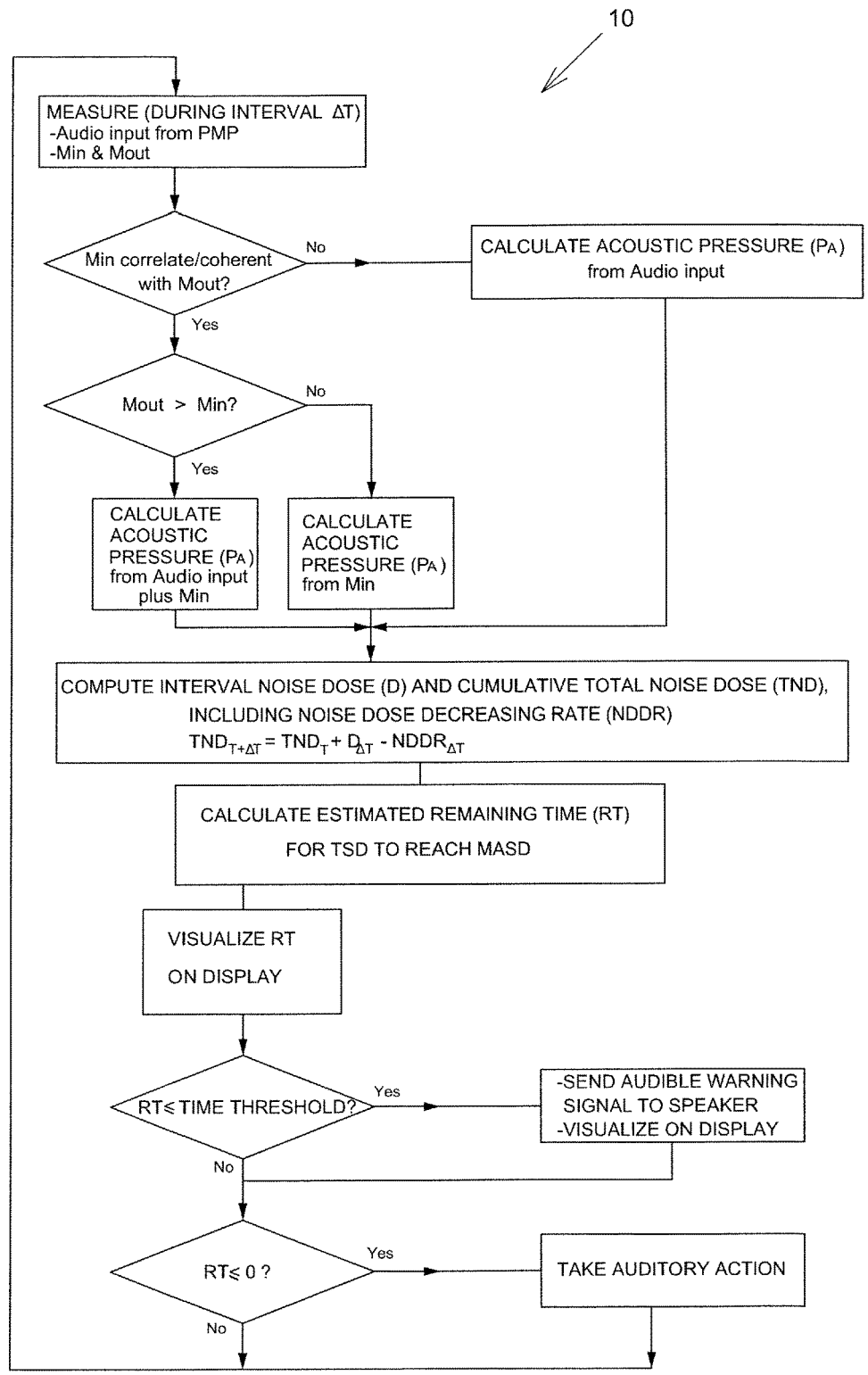
FIG. 2 is a simplified flow chart of an advanced communication earpiece method in accordance with an embodiment of the present invention, referring to a method of operation of the noise and music dose limiter (MDL) device of FIG. 1.

Referring now in more detail to FIGS. 1 and 2, there is shown simplified schematic bloc diagram of an embodiment 10 of an advanced communication earpiece device, as a sound or music dose limiter device, and a method for using the device in accordance with the present invention. The noise and music dose limiter (MDL) 10 typically includes a controller unit 12 connected to at least one, preferably a pair of custom-fitted in-ear devices 14 (only one being shown), such that the respective outer ear canal 15 of the user is essentially occluded thereby (snugly fit), for connection to an audio output of an audio source 16 such as a personal music player (PMP) or the like, or any electronic device adapted to send an audio signal to the speaker 18 of the each in-ear device 14, typically left and right devices.

In addition to the speaker 18, each in-ear device 14 includes an internal microphone 20 (Min) for measuring the sound/noise level inside the ear occluded canal 15, between the in-ear device 14 and the tympanic membrane, and an external microphone 22 (Mout) for measuring the external ambient sound/noise level reaching the corresponding outer ear of the user. These internal and external measured sound pressure levels, from internal 20 and external 22 microphones, of each in-ear device 14, as well as the corresponding (left or right) audio signal coming from the PMP 16 are input signals of the controller unit 12. Based on these inputs, the controller unit 12 calculates the total noise dose (TND), or total sound dose, reaching each user's ear, and provides for a remaining time estimate for listening to the input signal (such as music or the like) before the TND reaches the maximum acceptable sound dose (MASD) value or threshold considered to be harmful to the user, based on the most recent measured average sound level reaching each ear as well as on the user's own susceptibility, including physical characteristics (age, etc.), beyond which there might be some permanent hearing losses for the user. Upon the TND approaching, reaching or exceeding the MASD value, the controlled unit 12 typically sends an audio warning signal to the user, such as an audible repeated appropriate beep, or simply starts, at least intermittently, reducing the volume of the sound signal, or ultimately stops the audio signal sent to the speaker 18, or any other warning code as required.

More specifically, the controller device unit 12 performs the following steps in calculating the TND, for each ear, based on the internal (Min) and external (Mout) microphone measured sound pressure levels and the audio input from the PMP 16. The calculation being done at regular time intervals $\Delta T$, and the different sound pressure levels measured from the microphones 20, 22 and received from the PMP 16 are typically averaged via an RMS (Root Mean Square) estimator. For each time interval $\Delta T$, the evaluation consists of the measured sounds from both internal and external microphones 20, 22 being compared to find out if they correlate (essentially follow the same magnitude or amplitude profile over time on specific frequency sub-bands) and/or are coherent (essentially follow the same magnitude profile over frequency in specific time frames) with one another. If not, this means that there is significantly less external sound that reaches inside the occluded ear canal other than the one coming from the speaker 18, such that both measured sounds are different, and the estimated acoustic pressure that reaches the tympanic area is primarily due to the signal reaching the speaker 18, which is estimated taking into account the in-ear device loudspeaker sensitivity. If yes, the controller unit 12 then verifies if the measured sound from the external microphone 22 is significantly stronger, by a predetermined level difference of at least a few decibels (dBs), than the one measured by the internal microphone 20. If not, it essentially means that the in-ear device 12 is not worn by the user (since both measurements are considered to have similar measurands), and, in such a case, the estimated acoustic pressure that reaches the tympanic area is essentially the one reaching either microphone 20, or 22. If yes, it means that an external sound burst (disturbance) or the like reached inside the occluded ear canal 15 after passing through the in-ear device 14, in which case, the estimated acoustic pressure that reaches the tympanic area is due to both the sound measured by the internal microphone 20 that is distinct from the signal reaching the speaker 18 added to the signal reaching the speaker 18.

Based on the above estimated acoustic pressure level reaching the tympanic area, for the specified time interval $\Delta T$, a sound dose is calculated which is then added to the cumulative noise and music dose. Furthermore, an estimated dose decrease is calculated for that same time interval $\Delta T$ to account for a certain 'ear fatigue recuperation' of the ear, based on an estimated Noise Dose Decrease Rate (NDDR), or sound dose decrease rate, which could be either linear or non-linear (logarithmic or the like) over time, depending on time as well as on the current noise level reaching the ear, and subtracted from the cumulative sound dose (as it reduces the same) to obtain the estimated cumulative TND.

The NDDR could, for example assumes that the human ear totally recuperates from the MASD threshold in a few hours, such as 16 hours or the like, in the absence of any harmful noise, such as any noise above a predetermined safe level of 70 decibels or the like. On the other hand, in the presence of harmful noise, the higher the harmful noise is, the more the hearing recuperation time increases.

As mentioned hereinabove, upon the estimated TND, the controller unit 12 typically estimates, assuming a sound volume similar to the latest measured volume (over the last time interval, or the history of the last few time intervals), the remaining time (RT) for the user to listen to the music or the like from the PMP 16, or any other similar listening time-related information, and transmits that information to a display 24 which displays the estimated time thereon. Such a display 24 could be either in the form of a bar meter, of multiple leds (light emitting diodes), or a digital display. Similarly, upon the estimated TND approaching the MASD threshold, the controller unit 12 typically further sends an audible warning signal to the speaker 18, such a warning signal varying depending on the value of the estimated RT according to a predetermined warning code or the like. Ultimately, upon the estimated TND reaching and/or exceeding the MASD threshold within a time threshold, or one of a plurality of time thresholds, the controller unit 12 typically further simply starts, at least intermittently, reducing the volume of the sound signal, or ultimately stops the audio signal sent to the speaker 18, and also typically displays the corresponding situation of the display 24.

When both in-ear devices 14 are used, the controller unit 12 typically calculates only one TND, taking into consideration the worst (highest) estimated TND of the two devices 14 for each time interval ΔT.

Figure 3:
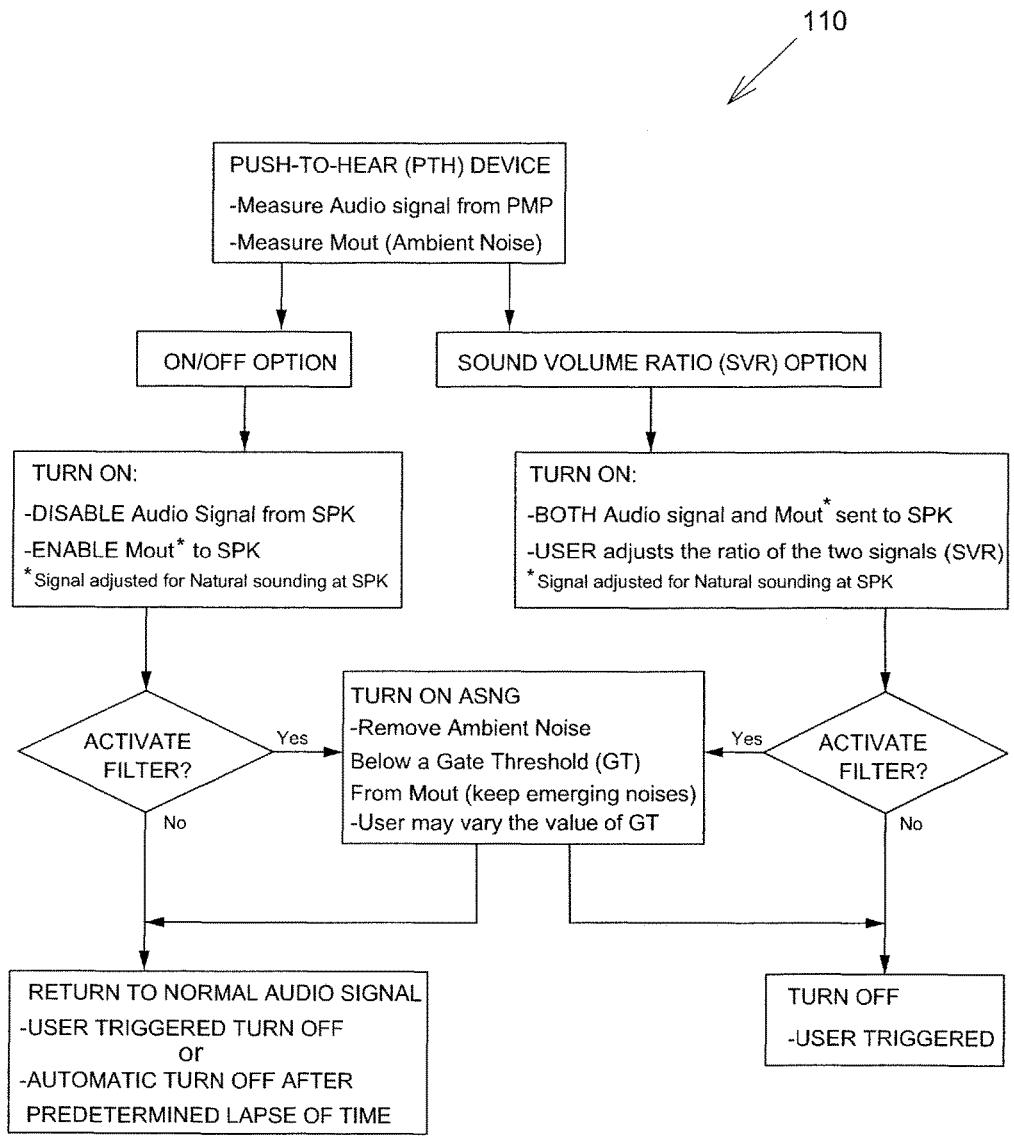
FIG. 3 is a simplified flow chart of an advanced communication earpiece method in accordance with an embodiment of the present invention, referring to a method of operation of the push-to-hear (PTH) device of FIG. 1.

Now referring more specifically to FIGS. 1 and 3, there is shown simplified schematic bloc diagram of an embodiment 110 of an advanced communication earpiece device, as a push-to-hear device, and a method for using the device in accordance with the present invention. The push-to-hear (PTH) device 110 typically includes a controller unit 112 connected to at least one, preferably a pair of custom-fitted in-ear devices 14 (only one being shown), such that the respective ear canal 15 of the user is essentially occluded thereby, for connection to an audio output of a personal music player (PMP) 16 or the like, or any electronic device adapted to send an audio signal to the speaker 18 of the each in-ear device 14, typically left and right devices.

In addition to the speaker 18, each in-ear device 14 of the PTH device 110 includes at least an external microphone 22 (Mout) for measuring the external ambient sound/noise reaching the corresponding ear or the user. The controller unit 112 typically includes an on/off activation switch to activate/deactivate the controller 112. When activated, the controller 112 disconnects the audio input from the PMP 16 from the headphone speakers 18 and connects the ambient sound measured by the corresponding external microphone 22 to the speakers 18, as represented by toggle switch 126, to enable the user to selectively and temporarily hear the ambient sound rather than the music or the like. Although not illustrated, when activated, the controller unit 112 could alternatively automatically switch back the device 110 to reconnect the audio signal from the PMP 16 instead of the ambient sound from the external microphone 22 after a predetermined lapse of time has occurred, such as 30 seconds, one minute or the like.

Alternatively, the PTH device 110 has a second activation/deactivation command, such as by simultaneously pressing two buttons or the like, as the two up ('+') and down ('−') volume buttons 128, during a predetermined time duration (such as 2 second or the like) for the controller unit 112 to allow both the audio signal from the PMP 16 and the ambient sound from the external microphone 22 to be simultaneously connected to the headphone speaker 18, and also press either the up and/or down volume buttons 128 to increase or decrease the sound volume ratio (SVR), or blending ratio, of the ambient sound over the audio signal.

The PTH device 110 typically provides for automatic, preferably digital, adjustment of the ambient noise measured from the external microphone 22 and transmitted to the headphone speaker 18 for a natural sounding thereof, the gain and frequency response adjustments depending on the actual type of headphone speaker and in-ear device.

Additionally, the PTH device 110 typically includes a user activatable electronic filter 130 of the ambient sound/noise signal measured by the external microphone 22. The ambient sound noise gating (ASNG) filter 130 essentially eliminates the noise portion of the ambient signal to keep only the noise emerging-type signals having an acoustic pressure larger than or above a gating threshold (GT). Preferably, the gating threshold GT, or microphone sensitivity threshold, is also adjustable by the user via up ('+') and down ('−') volume buttons 132 or the like. Alternatively, as an example, instead of using specific buttons 132, the same two buttons 128 could also be used for the GT adjustment, as long as the two buttons are simultaneously pressed during a second predetermined time duration, typically longer than the first one, for activation/deactivation of the ASNG filter 130.

Typically, the ASNG filter 130 can be used at any time during the operation of the PTH device 110, whichever option is selected by the user.

Figure 4A:
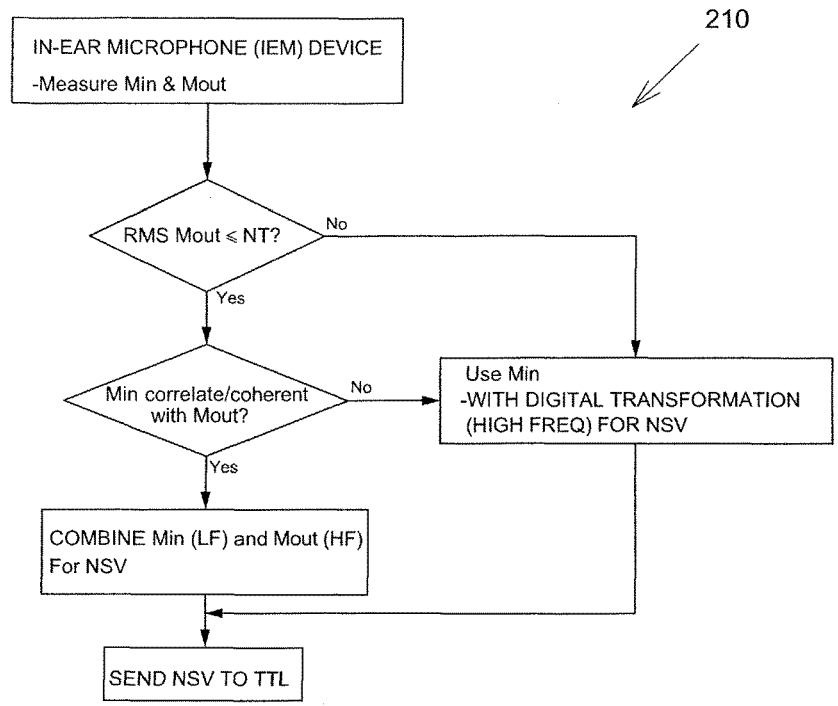
FIG. 4A is a simplified flow chart of an advanced communication earpiece method in accordance with an embodiment of the present invention, referring to a method of operation of the in-ear microphone (IEM) device of FIG. 1.
Figure 4B:
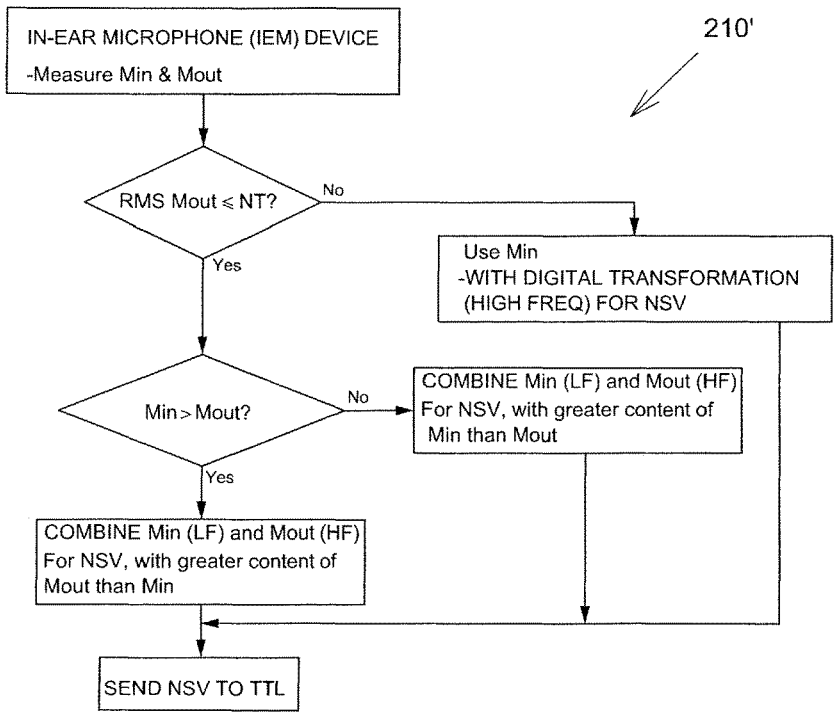
FIG. 4B is similar to FIG. 4A, showing an alternate method of operation of the in-ear microphone (IEM) device of FIG. 1.

Now referring more specifically to FIGS. 1, 4A and 4B, there is shown simplified schematic bloc diagram of an embodiment 210 of an advanced communication earpiece device, as an inside-the-ear microphone device, and a method for using the device in accordance with the present invention. The in-ear microphone (IEM) device 210 typically includes a controller unit 212 connected to at least one custom-fitted in-ear device 14, such that the corresponding outer ear canal 15 of the user is essentially occluded thereby (snugly fit).

In addition, the in-ear device 14 includes an internal microphone 20 (Min) for measuring the sound/noise, and also the user's voice inside the ear canal 15, between the in-ear device 14 and the tympanic membrane, and an external microphone 22 (Mout) for measuring the external ambient sound/noise reaching the corresponding ear or the user. These internal and external measured noises, from internal 20 and external 22 microphones, of the in-ear device 14 are input signals of the controller unit 212.

Based on these inputs, the controller unit 212 evaluates if the RMS value of the external noise is smaller or equal to a first noise threshold (NT). If not, this means that the external ambient noise is too loud and disturbs any sound voice that would be simultaneously measured by the external microphone 22. The user's voice is therefore captured by the internal microphone 20 before it is sent by the controller unit 212 of the IEM device 210 to a telecommunication transmission link (TTL), such as a Bluetooth™ system wireless link, a telephone or the like. In such a case, since the speech voice measured from the ear canal of the user is acoustically deformed, the controller unit 212 typically and digitally transforms the deformed speech voice into an enhanced speech signal (recreating especially the higher frequencies) which sounds more like a natural speech voice (NSV) from one's mouth.

The user's voice can be captured using either only the external microphone 22, by internal microphone 20 or by a combination (blending) of both signals from external microphone 22 and internal microphone 20. The controller unit 212 continuously monitors the levels and frequency characteristics of both external and internal picked-up signals and decides on the ratio to be applied to the blending of both signals. In a quiet environment, the user's voice will be primarily picked-up by the external microphone 22 that offers natural sound quality because of the extended frequency response. In a louder environment a mix of both microphone signals will be applied, using the internal microphone 20 as the primary reference signal and merging it with the high-frequency components of the voice signal picked-up by external microphone 22. Finally in a very loud environment, where the external microphone signal is unusable, only the internal microphone signal is used, and possibly enhanced with the aforementioned digital high-frequency reclamation processing. Since the ambient noise level in a given environment will be changing over time, the mixing algorithm of the controller unit 212 will constantly adapt the mixing ratio accordingly, with appropriate signal smoothing and cross-fading.

In the case the RMS value of the external noise is smaller or equal to NT, the measured sounds from both internal and external microphones 20, 22 are compared to find out if they correlate (essentially follow the same magnitude or amplitude profile over time on specific frequency sub-bands) and/or are coherent (essentially follow the same magnitude profile over frequency in specific time frames) with one another, by being above a second correlation threshold CT. If not, this means that the external noise, although not too loud, is significant enough inside the speech frequency band to alter the user's voice measured by the external microphone 22, and as above, only the signal captured by the internal microphone 20 is considered and preferably transformed by the controller unit 212 of the IEM device 210 into a NSV to be sent to the TTL. If yes, the controller unit 12 generates a combination of both the internal signal for preferably lower frequencies (LF) and external signal for preferably higher frequencies (HF), over the typical human voice frequency band to generate the best user's speech voice as the NSV signal to be sent to the TTL, as shown in FIG. 4A.

As shown in the embodiment 210' of FIG. 4B, an alternative approach, when the RMS value of the external noise is smaller or equal to NT, is to compare the levels of both the external 22 and internal 20 microphones and to assess if the wearer is speaking in a quiet but reverberant environment. In such case the external microphone 22 might pick-up a high signal level solely caused by the wearer's voice reflections. With the internal signal being generally larger than the external signal, a mix of both signals are considered by the controller unit 212 with greater content of external signal than internal signal, while with the external signal being larger than the internal signal, greater content of the internal signal is considered than the external signal. It is noted that the ratio of both signals for that latest comparison is typically different than 1:1 and typically depends on digital processing of the signals which incorporates an experimentally derived scaling factor. In order to avoid the controller unit 212 tendency to discard the signal from the external microphone 22 because of its high level, the internal microphone signal is then tested for user's voice content. If user is assessed to be speaking, both the external and internal signals are merged before being sent to the TTL. On the other hand, if no voice signal is present on the internal microphone, the external microphone signal will be faded-out from the mix by the controller unit 212.

Although the present advanced communication earpiece device embodiments and methods of use have been described with a certain degree of particularity, it is to be understood that the disclosure has been made by way of example only and that the present invention is not limited to the features of the embodiments described and illustrated herein, but includes all variations and modifications within the scope of the invention as hereinafter claimed.

The invention claimed is:

1. A communication device for allowing a voice of a user to be transmitted to a telecommunication transmission link, said communication device comprising:
    an in-ear device for substantially occluding an outer ear canal of the user, said in-ear device including an internal microphone for measuring a sound pressure level inside the occluded outer ear canal, and an external microphone for measuring an external ambient sound pressure level reaching the user's ear, the internal and external measured sound pressure levels including respective acoustically deformed speech voice from the user; and
    a controller device connecting to the internal and external microphones for receiving respective internal and external measured sound pressure levels, said controller device performing an evaluation of the external measured sound pressure level, digitally generating an enhanced natural speech voice signal from the internal sound pressure level depending on the evaluation when the external measured sound pressure level is larger than a noise threshold, and from both the internal and external sound pressure levels when the external measured sound pressure level is smaller or equal to the noise threshold, and transmitting the generated enhanced natural speech voice signal to the telecommunication transmission link;
    wherein, when the external measured sound pressure level is smaller or equal to the noise threshold, said controller device generates the enhanced natural speech voice signal from both the internal and external sound pressure levels when the internal and external sound pressure levels correlate and/or are coherent with one another, and from the internal sound pressure level when the internal and external sound pressure levels do not correlate and/or are not coherent with one another.

2. The communication device of claim 1, wherein, when generating the enhanced natural speech voice signal from both the internal and external sound pressure levels, said controller device substantially combines, over a human voice frequency band, a high frequency portion of the external sound pressure level with a low frequency portion of the internal sound pressure level to generate the enhanced natural speech voice signal.

3. A method for transmitting a voice of a user wearing an in-ear device substantially occluding a user's outer ear canal to a telecommunication transmission link, the in-ear device including an internal microphone for measuring a sound pressure level inside the occluded outer ear canal, and an external microphone for measuring an external ambient sound pressure level reaching the user's ear, the internal and external measured sound pressure levels including respective acoustically deformed speech voice from the user, said method comprising the steps of:
    measuring the internal and external sound pressure levels;
    performing an evaluation of the external measured sound pressure level;
    digitally generating an enhanced natural speech voice signal from the internal sound pressure level depending on the evaluation when the external measured sound pressure level is larger than a noise threshold, and, when the external measured sound pressure level is smaller or equal to the noise threshold, from both the internal and external sound pressure levels when the internal and external sound pressure levels correlate and/or are coherent with one another, and from the internal sound pressure level when the internal and external sound pressure levels do not correlate and/or are not coherent with one another; and transmitting the generated enhanced natural speech voice signal to the telecommunication transmission link.

4. The method of claim 3, wherein the step of generating includes, when generating the enhanced natural speech voice signal from both the internal and external sound pressure levels, substantially combining, over a human voice frequency band, a high frequency portion of the external sound pressure level with a low frequency portion of the internal sound pressure level to generate the enhanced natural speech voice signal.

\* \* \* \* \*